United States Patent
Zhou et al.

(10) Patent No.: US 12,374,378 B2
(45) Date of Patent: Jul. 29, 2025

(54) MONITORING CIRCUIT, REFRESH METHOD AND MEMORY

(71) Applicant: Changxin Memory Technologies, Inc., Anhui (CN)

(72) Inventors: Runfa Zhou, Hefei (CN); Kyounghan Kwon, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 157 days.

(21) Appl. No.: 18/230,859

(22) Filed: Aug. 7, 2023

(65) Prior Publication Data
US 2024/0071458 A1    Feb. 29, 2024

Related U.S. Application Data

(63) Continuation of application No. PCT/CN2022/123866, filed on Oct. 8, 2022.

(30) Foreign Application Priority Data

Aug. 30, 2022    (CN) .......................... 202211048296.5

(51) Int. Cl.
*G11C 11/406*    (2006.01)
(52) U.S. Cl.
CPC ....... *G11C 11/406* (2013.01); *G11C 11/40611* (2013.01)
(58) Field of Classification Search
CPC .......... G11C 11/406; G11C 2211/4061; G11C 2211/4067; G11C 11/40611; G11C 11/408
See application file for complete search history.

(56) References Cited

U.S. PATENT DOCUMENTS

2016/0078911 A1    3/2016  Fujiwara et al.
2018/0342283 A1*  11/2018  Lee ........................ G11C 11/408
(Continued)

FOREIGN PATENT DOCUMENTS

| CN | 114121077 A | 3/2022 |
|---|---|---|
| CN | 114420181 A | 4/2022 |
| JP | 2016-051489 A | 4/2016 |

OTHER PUBLICATIONS

PCT International Search Report and the Written Opinion mailed Jan. 28, 2023, issued in related International Application No. PCT/CN2022/123866, with partial English machine translation (11 pages).

*Primary Examiner* — Jay W. Radke
(74) *Attorney, Agent, or Firm* — Sheppard Mullin Richter & Hampton LLP (57) ABSTRACT

A monitoring circuit includes: a sampling module, configured to sample an initial address to obtain a monitoring address; a counting module, configured to adjust a counting value of a first counter corresponding to the monitoring address and set a predetermined value for the monitoring address, and a magnitude of the set predetermined value is positively correlated with duration for which the monitoring address is stored in the counting module; and a processing module, configured to compare the counting value of the first counter corresponding to each monitoring address with the predetermined value, where if the counting value of the first counter is greater than or equal to the predetermined value, the monitoring address is retained, and if the counting value of the first counter is less than the predetermined value, the monitoring address is released, and the first counter and the predetermined value corresponding to the monitoring address are reset.

20 Claims, 5 Drawing Sheets

(56) References Cited

U.S. PATENT DOCUMENTS

2022/0165328 A1 5/2022 Ishikawa et al.
2022/0197740 A1 6/2022 Rooney et al.
2022/0270662 A1 8/2022 Kang et al.

* cited by examiner

| Monitoring address | Counting value | Predetermined value |
|---|---|---|
| Address1 | s1 | c+y*t1 |
| Address2 | s2 | c+y*t2 |
| Address3 | s3 | c+y*t3 |
| Address4 | s4 | c+y*t4 |
| Address5 | s5 | c+y*t5 |
| ... | | |

MONITORING CIRCUIT, REFRESH METHOD AND MEMORY

CROSS-REFERENCE TO RELATED APPLICATIONS

This application is a continuation application of International Patent Application No. PCT/CN2022/123866, filed on Oct. 8, 2022, which claims priority to Chinese Patent Application No. 202211048296.5, filed on Aug. 30, 2022, and entitled "MONITORING CIRCUIT, REFRESH METHOD AND MEMORY." The above-referenced applications are incorporated herein by reference in their entirety.

TECHNICAL FIELD

The present invention relates to the field of semiconductor circuit design, and in particular to a monitoring circuit, a refresh method, and a memory.

BACKGROUND

Dynamic random access memory (DRAM) stores data using a 1T1C structure, where one transistor is connected to one storage region. The transistor is controlled by a word line (WL). When the WL is activated, the charge in the storage region is shared with the charge on the bit line (BL) to enable reading data from or writing data into the target storage region.

Frequent activation of word lines can cause charge loss in adjacent storage regions, which may lead to errors in data stored in the storage regions. To resolve the above-mentioned problems, at present, a common method is to perform supplementary refresh on the storage regions adjacent to the most frequently activated word line addresses based on a refresh cycle, thereby avoiding errors in stored data. However, performing supplementary refresh on storage regions using this method requires counting all the activated word line addresses and driving a large number of counters. This can lead to high power consumption and is not conductive to practical application.

Therefore, achieving supplementary refresh on storage regions with low power consumption to ensure the accuracy of data stored in storage regions is an urgent technical issue to be addressed at present.

SUMMARY

Some embodiments of the present invention provide a monitoring circuit, including: a sampling module, configured to sample an initial address to obtain a monitoring address, where the initial address is a word line address activated in a memory in which the monitoring circuit is located; a counting module, connected to the sampling module and configured to adjust a counting value of a first counter corresponding to the monitoring address based on the monitoring address obtained, where the counting module is further configured to set a predetermined value for the monitoring address, and a magnitude of the set predetermined value is positively correlated with duration for which the monitoring address is stored in the counting module; and a processing module, connected to the counting module and configured to compare the counting value of the first counter corresponding to each monitoring address with the predetermined value based on an update signal, where if the counting value of the first counter is greater than or equal to the predetermined value, the monitoring address is retained; if the counting value of the first counter is less than the predetermined value, the monitoring address is released, and the first counter and the predetermined value corresponding to the monitoring address are reset.

In some embodiments, the counting module includes: a determining unit, connected to the sampling module and configured to determine whether the monitoring address obtained is stored based on the monitoring address obtained and the monitoring address stored, and generate a first control signal if the monitoring address is stored, or generate a second control signal if the monitoring address is not stored; a counting unit, connected to the sampling module and the determining unit, and configured to increase the counting value of the first counter corresponding to the monitoring address by 1 based on the first control signal, or add a new first counter corresponding to the monitoring address and set a counting value of the new first counter to 1 based on the second control signal; and a reference unit, connected to the counting unit and the determining unit, and configured to set the predetermined value for the monitoring address based on the second control signal, store the set predetermined value in the counting unit, and adjust the predetermined value based on the update signal.

In some embodiments, the magnitude of the set predetermined value is positively correlated with the duration for which the monitoring address is stored in the counting module, including: the magnitude of the set predetermined value is positively correlated with a number of update cycles during which the monitoring address is retained in the counting module, where the update cycle is a time interval between adjacent update signals.

In some embodiments, the reference unit includes: a setting subunit, connected to the counting unit and the determining unit, and configured to set the predetermined value corresponding to the monitoring address based on a first initial value in response to the second control signal; and an adjustment subunit, configured to receive the update signal and adjust, based on the update signal, the predetermined value corresponding to the monitoring address retained in the counting unit.

In some embodiments, the predetermined value is a counting result of a second counter in the counting unit; and the adjusting, based on the update signal, the predetermined value corresponding to the monitoring address retained in the counting unit includes: accumulating a second initial value to the second counter corresponding to the retained monitoring address based on the update signal.

In some embodiments, the first initial value is set to 2n and the second initial value is set to 2 m, where m and n are positive integers greater than or equal to 1.

In some embodiments, the processing module includes: a first processing unit, connected to the counting module and configured to receive the counting value of the first counter and the predetermined value corresponding to each monitoring address, and latch and transmit, based on control of the update signal, the counting value of the first counter and the predetermined value to a comparison unit, where the comparison unit is connected to the first processing unit and is configured to compare the counting value of the first counter with the predetermined value, and generate and output a release control signal when the counting value of the first counter is smaller than the predetermined value; and a second processing unit, connected to the comparison unit and the counting module, and configured to release the corresponding monitoring address in the counting module based on the release control signal, and reset the first counter and the predetermined value corresponding to the monitoring address.

In some embodiments, the latching and transmitting, based on the control of the update signal, the counting value of the first counter and the predetermined value to a comparison unit includes: the update signal controls an input of a driving clock signal, where when the update signal has a valid level, the driving clock signal is input to the processing module, or when the update signal has an invalid level, no driving clock signal is input; when the driving clock signal is input, the processing module latches and transmits the counting value of the first counter and the predetermined value to the comparison unit.

In some embodiments, the sampling module performs sampling based on a predetermined interval to obtain the monitoring address, and the predetermined interval is set to perform sampling on the monitoring address once upon occurrence of every x initial addresses, where x is a positive integer.

In some embodiments, x is a positive integer less than or equal to 16.

In some embodiments, the update signal includes a refresh signal and a count adjustment signal, where the refresh signal is configured to instruct the memory to perform a refresh operation, and the count adjustment signal is provided within an interval between two adjacent refresh signals.

In some embodiments, a refresh operation of the memory further includes refreshing adjacent rows of y monitoring addresses with a largest counting value in the corresponding first counter among the monitoring addresses retained in the counting module, where y is a positive integer greater than or equal to 1; and after the refreshing, releasing the y monitoring addresses with the largest counting value in the counting module, and resetting the first counter and the predetermined value corresponding to the y monitoring addresses with the largest counting value.

In some embodiments, the counting unit is further configured to discard the newly added monitoring address, based on the second control signal, when each of the first counters in the counting unit has the corresponding monitoring address.

Some other embodiments of the present invention provide a refresh method, applied to the monitoring circuit provided in the above-mentioned embodiments, including: step S1: obtaining a monitoring address and detecting whether the monitoring address is stored, where if the monitoring address is stored, performing step S2, and if the monitoring address is not stored, performing step S3; step S2: increasing a counting value of a first counter corresponding to the monitoring address by 1; step S3: counting the monitoring address by using a new first counter, setting a counting value of the new first counter to 1, and setting a corresponding predetermined value for the monitoring address; step S4: adjusting the predetermined value corresponding to the retained monitoring address based on an update signal, and comparing a counting value of a first counter corresponding to each monitoring address with the predetermined value; if the counting value of the first counter is greater than or equal to the predetermined value, performing step S5; if the counting value of the first counter is less than the predetermined value, performing step S6; step S5: retaining the monitoring address, and continuing to perform step S1; and step S6: releasing the monitoring address, resetting the first counter and the predetermined value corresponding to the monitoring address, and continuing to perform step S1.

In some embodiments, the setting a corresponding predetermined value for the monitoring address includes: obtaining a newly added monitoring address, and setting a predetermined value corresponding to the newly added monitoring address based on a first initial value; and the adjusting the predetermined value corresponding to the retained monitoring address based on an update signal includes: accumulating the predetermined value corresponding to the retained monitoring address based on a second initial value.

Still some other embodiments of the present invention provide a memory, configured to obtain a word line address to be refreshed based on the monitoring circuit provided in the above-mentioned embodiments.

BRIEF DESCRIPTION OF DRAWINGS

One or more embodiments are illustrated by way of example in the accompanying drawings. These illustrative examples do not constitute a limitation on the embodiments. Unless otherwise specifically stated, the figures in the accompanying drawings are not drawn to scale. To describe the technical solutions in the embodiments of the present invention or in the conventional technologies more clearly, the following briefly describes the accompanying drawings needed for describing the embodiments. It is apparent that the accompanying drawings in the following description show merely some embodiments of the present invention, and a person of ordinary skill in the art can still derive other drawings from these accompanying drawings without creative efforts.

DESCRIPTION OF EMBODIMENTS

It can be learned from the BACKGROUND section that, frequent activation of word lines can cause charge loss in adjacent storage regions, which may lead to errors in data stored in the storage regions. To resolve the above-mentioned problems, at present, a common method is to perform supplementary refresh on the storage regions adjacent to the most frequently activated word line addresses based on a refresh cycle, thereby avoiding errors in stored data. However, performing supplementary refresh on storage regions using this method requires counting all the activated word line addresses and driving a large number of counters. This can lead to high power consumption and is not conductive to practical application.

Some embodiments of the present invention provide a monitoring circuit to implement supplementary refresh of a specific row in a storage region with low power consumption, thereby ensuring accuracy of data stored in each storage region and reducing the number of counters that need to be driven by a memory. This is more suitable for actual design of a memory.

A person of ordinary skill in the art can understand that in some embodiments of the present invention, many technical details are provided to make readers better understand the present invention. However, even without these technical details and various variations and modifications based on the following embodiments, the technical solutions sought to be protected in the present invention can still be implemented. The following division of embodiments is intended for ease of description and should not constitute any limitation on specific implementations of the present invention. Embodiments can be combined with each other or mutually referenced provided that no contradiction occurs between the embodiments.

Figure 1:
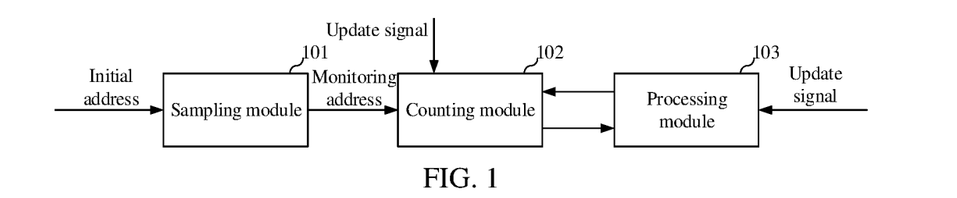
FIG. 1 is a schematic structural diagram of a monitoring circuit according to some embodiments of the present invention.
Figure 2:
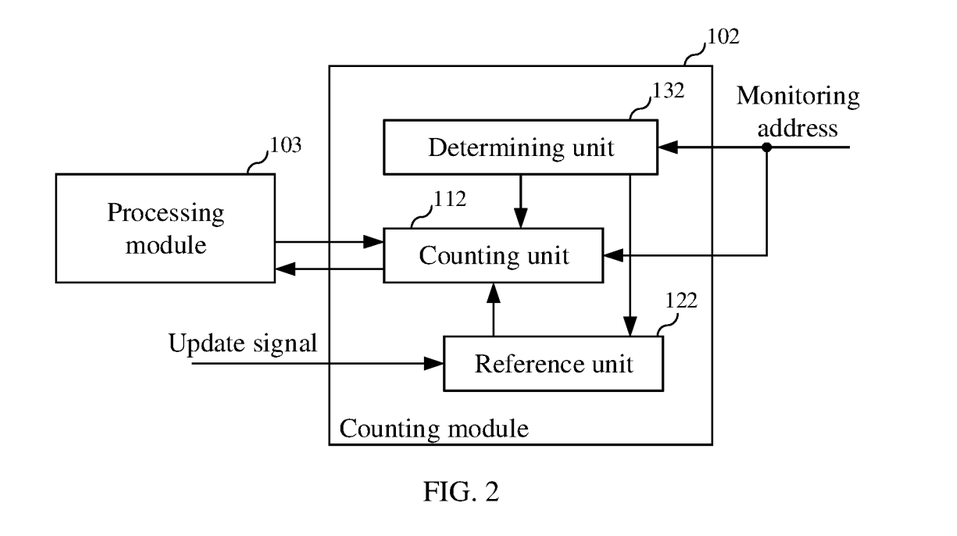
FIG. 2 is a schematic structural diagram of a counting module according to some embodiments of the present invention.
Figure 3:
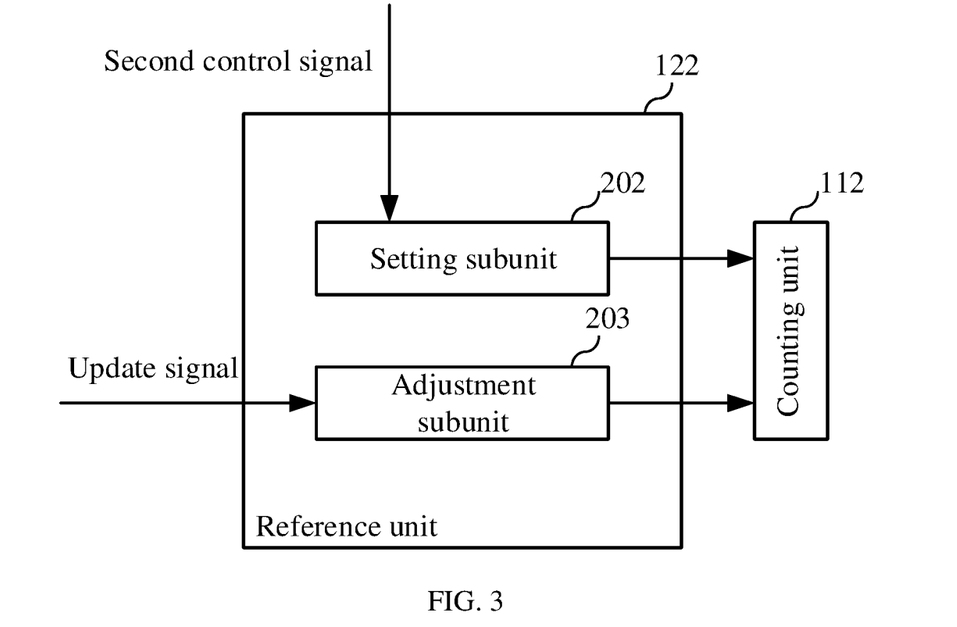
FIG. 3 is a schematic structural diagram of a reference unit according to some embodiments of the present invention.
Figure 4:
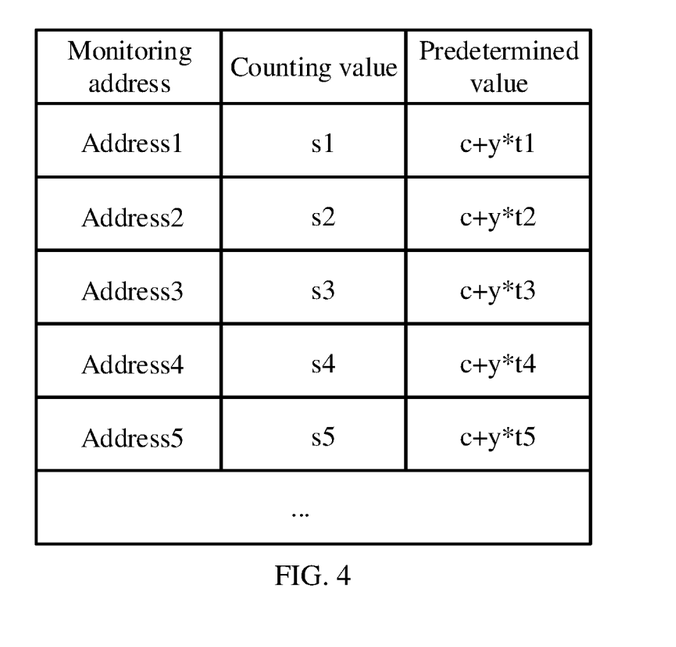
FIG. 4 and FIG. 5 are schematic diagrams illustrating the principles for retaining and releasing monitoring addresses by a monitoring circuit according to some embodiments of the present invention.
Figure 5:
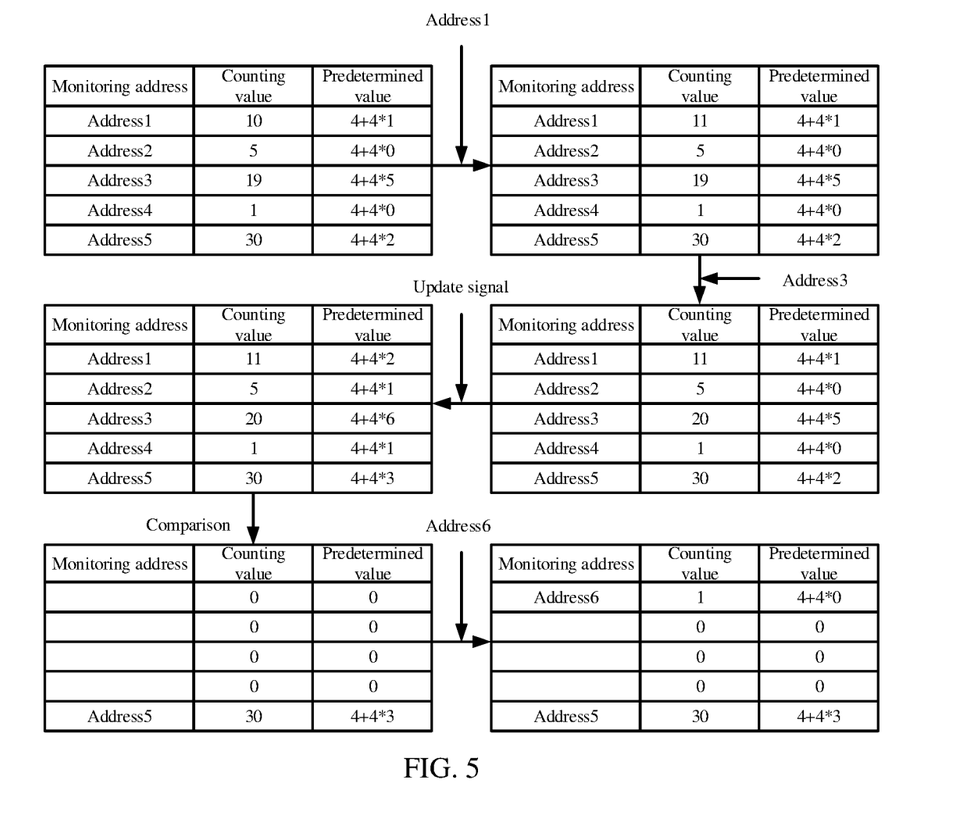
Figure 6:
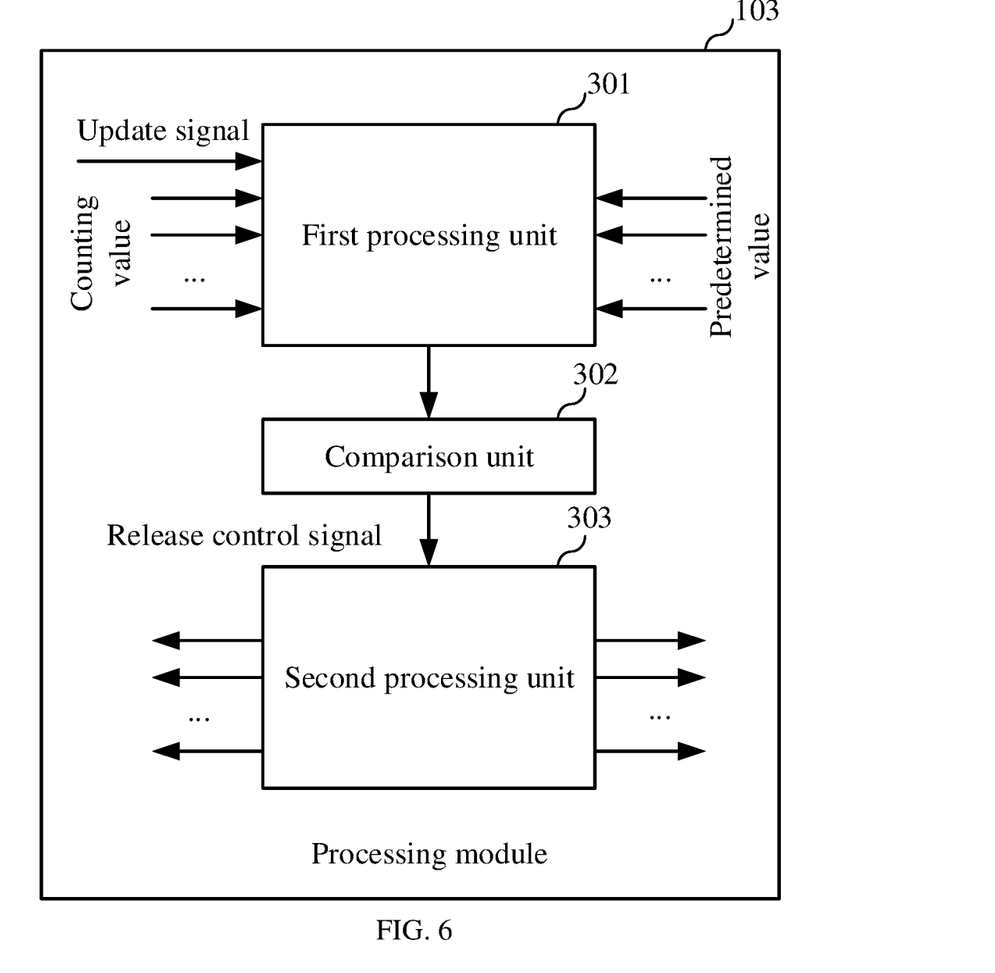
FIG. 6 is a schematic structural diagram of a processing module according to some embodiments of the present invention.
Figure 7:
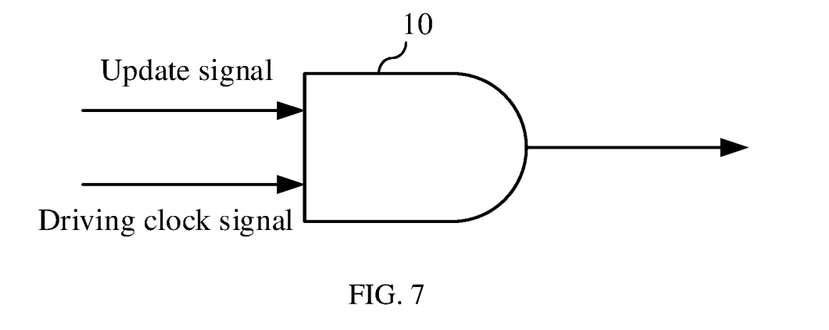
FIG. 7 is a schematic structural diagram of a driving clock signal input method according to some embodiments of the present invention.

FIG. 1 is a schematic structural diagram of a monitoring circuit according to some embodiments. FIG. 2 is a schematic structural diagram of a counting module according to some embodiments. FIG. 3 is a schematic structural diagram of a reference unit according to some embodiments. FIG. 4 and FIG. 5 are schematic diagrams illustrating the principles for retaining and releasing monitoring addresses by a monitoring circuit according to some embodiments. FIG. 6 is a schematic structural diagram of a processing module according to some embodiments. FIG. 7 is a schematic structural diagram of a driving clock signal input method according to some embodiments. The following describes in detail the monitoring circuit provided in some embodiments with reference to the accompanying drawings. Details are as follows:

Referring to FIG. 1, a monitoring circuit includes: a sampling module 101, configured to sample an initial address to obtain a monitoring address, where the initial address is a word line address activated in a memory in which the monitoring circuit is located; a counting module 102, connected to the sampling module 101 and configured to adjust a counting value of a first counter corresponding to the obtained monitoring address based on the obtained monitoring address, where the counting module 102 is further configured to set a predetermined value for the monitoring address, and a magnitude of the set predetermined value is positively correlated with duration for which the monitoring address is stored in the counting module 102; specifically, a longer duration for which the monitoring address is stored in the counting module 102 indicates a larger predetermined value corresponding to the monitoring address, and a shorter duration for which the monitoring address is stored in the counting module 102 indicates a smaller predetermined value corresponding to the monitoring address; and a processing module 103, connected to the counting module 102 and configured to compare the counting value of the first counter corresponding to each monitoring address with the predetermined value based on an update signal, where if the counting value of the first counter is greater than or equal to the predetermined value, the monitoring address is retained; if the counting value of the first counter is less than the predetermined value, the monitoring address is released, and the first counter and the predetermined value corresponding to the monitoring address are reset.

In the monitoring circuit provided in some embodiments, the processing module 103 continuously releases a monitoring address whose counting value is less than the predetermined value in the counting module 102 based on the update signal, that is, continuously releases a noise address recorded in the counting module 102, so that the counting module 102 can record a new monitoring address to avoid a waste of counter resources caused by continuous recording of the noise address and reduce the number of first counters that need to be driven by the monitoring circuit, thereby reducing power consumption of the monitoring circuit. In addition, the processing module 103 retains a monitoring address whose counting value is greater than or equal to the predetermined value, and the adjacent rows of the monitoring address are used for supplementary refresh of the memory, that is, a word line address with a number of activation times being greater than a predetermined value is retained to ensure accuracy of data stored in each storage region.

With respect to the sampling module 101 provided in these embodiments, in some embodiments, the sampling module 101 performs sampling based on a predetermined interval to obtain the monitoring address, and the predetermined interval is set to perform sampling on the monitoring address once upon occurrence of every x initial addresses, where x is a positive integer. In other words, each time the memory activates x word line addresses, the sampling module 101 performs sampling on the monitoring address once. By setting a sampling probability for the sampling module 101, the number of word line addresses that need to be obtained by the sampling module 101 is reduced. In other words, the power consumption of the monitoring circuit is further reduced through sampling detection. In some embodiments, x may be a positive integer less than or equal to 16. In some embodiments, x may be set to a positive integer less than or equal to 8, for example, x may be set to a positive integer such as 8, 6, 4, or 2.

With respect to the counting module 102 provided in these embodiments, in some embodiments, referring to FIG. 2, the counting module 102 includes: a determining unit 132, connected to the sampling module 101 and configured to determine whether the obtained monitoring address is stored based on the obtained monitoring address and the stored monitoring address, and generate a first control signal if the monitoring address is stored, or generate a second control signal if the monitoring address is not stored; a counting unit 112, connected to the sampling module 101 and the determining unit 132, and configured to increase the counting value of the first counter corresponding to the monitoring address by 1 based on the first control signal, or add a new first counter corresponding to the monitoring address and set the counting value of the new first counter to 1 based on the second control signal; and a reference unit 122, connected to the counting unit 112 and the determining unit 132, and configured to set the predetermined value for the monitoring address based on the second control signal, store the set predetermined value in the counting unit 112, and adjust the predetermined value based on the update signal.

In some other embodiments, the predetermined value may also be set to be stored in the reference unit. It should be noted that, in the following description of some embodiments, an example in which the predetermined value is set in the counting unit 112 is used for detailed description.

In some other embodiments, the reference unit 122 may also store monitoring addresses. In such case, the reference unit 122 needs to be connected to the sampling module 101 and is configured to add a monitoring address if there is no identical monitoring address stored in the reference unit 122 and configured to set a corresponding predetermined value for the monitoring address.

It should be noted that, with respect to the first counter, the capacity of the first counter is set based on a time interval for receiving a refresh command, a predetermined interval for sampling, and a time interval for activating a word line in the memory. In some embodiments, in the DDR4 standard, under a normal operating temperature, for a memory with a 16G capacity in a 1× refresh mode, the time interval for activating a word line is tRC=45 ns, the predetermined interval for sampling is tREFC=550 ns, and the time interval for receiving a refresh command is tREFI=7.8 us. In such case, in a burst transmission mode of the memory, the number of word line addresses that can be activated by the memory within 9*tREFI is 9*(tREFI−tREFC)/tRC=161. If a capacity of the first counter is b, it needs to be ensured that 2 b>161, that is, b is at least 8. In such case, the capacity of the first counter is set to 8 bits. It should be noted that the example value in such case is merely used for a person skilled in the art to understand the method for setting the capacity of the first counter and does not constitute a limitation on the embodiments.

In practice, the number of first counters in the counting unit 122 is limited, and the counting unit 122 is further configured to discard a newly added monitoring address based on the second control signal when each first counter in the counting unit 122 has a corresponding monitoring address, that is, all the first counters in the counting unit 122 have started counting, and the counting unit 122 is full of stored monitoring addresses.

With respect to the set predetermined value, in some embodiments, the magnitude of the set predetermined value is positively correlated with the number of update cycles during which the monitoring address is retained in the counting module 102, where the update cycle is a time interval between adjacent update signals.

In some embodiments, referring to FIG. 3, the reference unit 122 includes: a setting subunit 202, connected to the counting unit 112 and the determining unit 132, and configured to set the predetermined value corresponding to the monitoring address based on a first initial value in response to the second control signal; and an adjustment subunit 203, configured to receive the update signal and adjust, based on the update signal, the predetermined value corresponding to the monitoring address retained in the counting unit 112. After the determining unit 132 determines that a new monitoring address appears, the reference unit 122 sets a predetermined value for the new monitoring address. After receiving the update signal, the adjustment subunit 203 increases the predetermined value corresponding to the monitoring address retained in the counting unit 112, so that the magnitude of the set predetermined value is positively correlated with the number of update cycles during which the monitoring address is retained in the counting module 102.

In some embodiments, the predetermined value is the counting result of a second counter in the counting unit 112, and the adjustment subunit 203 is configured to accumulate a second initial value to the second counter corresponding to the retained monitoring address based on the update signal.

Referring to FIG. 4, the counting value is the counting result of the first counter and is used to represent the number of times the corresponding monitoring address is counted. The predetermined value is the counting result of the second counter and is used to represent a recorded reference value of the corresponding monitoring address, where c represents the first initial value that is set by the setting subunit 201, y represents the step for each adjustment by the adjustment subunit 203, and t1-t5 represent the number of update cycles during which the corresponding monitoring address is stored. With respect to a monitoring address whose counting value is greater than or equal to a predetermined value, that is, a word line address with a number of activation times reaching a predetermined number of times in the memory, there is a risk of malicious attack, and the corresponding monitoring address requires supplementary refresh. With respect to a monitoring address whose counting value is less than a predetermined value, no supplementary refresh is required because the monitoring address is a normally accessed word line address. In addition, a continuously activated word line address is more likely to cause an error in data in adjacent storage regions. In some embodiments, the predetermined value corresponding to the monitoring address is set to gradually increase with an increase of the retention time of the monitoring address. In other words, only the continuously activated word line address is more likely to cause an error in data stored in adjacent storage regions. Such an address deserves more attention and should be retained. In addition, adjacent rows of such an address should be refreshed.

It should be noted that, with respect to the above-mentioned supplementary refresh, there are a plurality of supplementary refresh methods. Adjacent rows of a monitoring address with the largest counting value in a corresponding first counter stored in the counting unit 122 can be supplementarily refreshed based on each update signal. Similarly, it may be set that adjacent rows of a monitoring address with the largest counting value are supplementarily refreshed based on every n update signals. Similarly, it may also be set that adjacent rows of a plurality of monitoring addresses are refreshed through a single supplementary refresh. The adjacent rows may be adjacent address rows such as +1/−1 and +1/−2 of the monitoring address.

In some embodiments, the first initial value is set to 2n, and the second initial value is set to 2 m, where m and n are positive integers greater than or equal to 1. In some embodiments, m and n may be set to 2, 3, 4 or 5. Correspondingly, m and n may be set to the same value, or may be set to different values.

For an operating principle of the counting module 102 provided above, references can be made to FIG. 5. It should be noted that a specific value shown in FIG. 5 is merely used for a person skilled in the art to understand the operating principle of the counting module 102 in the embodiments and does not constitute a limitation on the embodiments.

Referring to FIG. 5, and with reference to FIG. 2 and FIG. 3, the determining unit 132 generates a first control signal when receiving the monitoring address Address1 sampled by the sampling module 101, and the counting unit 112 controls the counting value of the first counter corresponding to the monitoring address Address1 to increase by 1 (from 10 to 11). The determining unit 132 generates a first control signal when receiving the monitoring address Address3 sampled by the sampling module 101, and the counting unit 112 controls the counting value of the first counter corresponding to the monitoring address Address3 to increase by 1 (from 19 to 20). When the reference unit 122 receives an update signal, it indicates that the recorded monitoring address has been stored for one more update cycle, and the reference unit 122 adjusts the predetermined value corresponding to the monitoring address in the counting unit 112, where the predetermined value of the monitoring address Address1 changes from 4+4*1 to 4+4*2, the predetermined value of the monitoring address Address2 changes from 4+4*0 to 4+4*1, the predetermined value of the monitoring address Address3 changes from 4+4*5 to 4+4*6, the predetermined value of the monitoring address Address4 changes from 4+4*0 to 4+4*1, and the predetermined value of the monitoring address Address5 changes from 4+4*2 to 4+4*3. A continuously activated word line address is more likely to cause an error in data in adjacent storage regions. The predetermined value corresponding to the monitoring address is set to gradually increase with an increase of the retention time of the monitoring address. In other words, only the continuously activated word line address is more likely to cause an error in data stored in adjacent storage regions. Such an address deserves more attention and should be retained. In addition, adjacent rows of such an address should be refreshed. Then, the processing module 103 compares the counting value of each monitoring address with the predetermined value, retains the monitoring address whose counting value is greater than or equal to the predetermined value, and releases the monitoring address whose counting value is less than the predetermined value. After the comparison, in the counting unit 112, the monitoring address Address5 is retained and other monitoring addresses are released, and the corresponding first counters and predetermined values are reset. When the determining unit 132 receives the monitoring address Address6 sampled by the sampling module 101, because the counting module 102 does not include the monitoring address Address6, the determining unit 132 generates a second control signal. In such case, the counting unit 112 adds the new monitoring address Address6 and sets the counting value of the first counter corresponding to the monitoring address Address6 to 1, and the reference unit 122 sets a predetermined value 4+4*0 for the monitoring address Address6.

In the above-mentioned implementations, the first initial value set for the predetermined value of the monitoring address is 4, and the second initial value accumulated based on the update signal is set to 4. After the update signal is received, the predetermined value of the retained monitoring address is first accumulated, and then the counting value is compared with the predetermined value. In some other implementations, after the update signal is received, it may alternatively be set that the counting value is first compared with the predetermined value, and then the predetermined value of the retained monitoring address is accumulated to reduce the number of second counters that need to be adjusted by the monitoring circuit, thereby reducing the power consumption of the monitoring circuit.

In addition, in some embodiments, the predetermined value has a maximum value, and the value of the second counter does not continue to be accumulated after reaching the maximum value. When the counting value of the first counter corresponding to the monitoring address is greater than or equal to the maximum value, it indicates that the data in the storage region adjacent to the monitoring address is prone to an error and requires supplementary refresh. In such case, the predetermined value does not need to be accumulated, thereby avoiding unnecessary update of the value of the second counter.

With respect to the processing module 103 provided in some embodiments, referring to FIG. 6, in some embodiments, the processing module 103 includes: a first processing unit 301, connected to the counting module 102 and configured to receive the counting value of the first counter and the predetermined value corresponding to each monitoring address, and latch and transmit, based on control of the update signal, the counting value of the first counter and the predetermined value to a comparison unit 302, where the comparison unit 302 is connected to the first processing unit 301 and is configured to compare the counting value of the first counter with the predetermined value, and generate and output a release control signal when the counting value of the first counter is smaller than the predetermined value; and a second processing unit 303, connected to the comparison unit 302 and the counting module 102, and configured to release the corresponding monitoring address in the counting module 102 based on the release control signal, and reset the first counter and the predetermined value (the second counter) corresponding to the monitoring address.

With reference to the example of FIG. 5, with respect to the monitoring addresses Address1, Address2, Address3, and Address4, the counting values are smaller than the predetermined values, the comparison unit 302 generates a release control signal, and the second processing unit 303 releases the monitoring addresses Address1, Address2, Address3, and Address4 in the counting module 102 based on the release control signal, and resets the first counters and the predetermined values (the second counter) corresponding to the monitoring addresses Address1, Address2, Address3, and Address4.

In some embodiments, the processing module 103 is driven based on the driving clock signal, and the update signal controls an input of the driving clock signal, where when the update signal has a valid level, the driving clock signal is input to the processing module 103, or when the update signal has an invalid level, no driving clock signal is input; when the driving clock signal is input, the processing module 103 latches and transmits the counting value of the first counter and the predetermined value to the comparison unit. Referring to FIG. 7, the driving clock signal and the update signal are received by using an input terminal of an AND gate 10, so that the driving clock signal can be input to the processing module 103 when the update signal has a valid level.

It should be noted that, as described above, the input of the driving clock signal is implemented by using the AND gate 10, and the valid level of the update signal is a high level by default. In some embodiments, if the valid level of the update signal is a low level, the AND gate 10 may be replaced with an OR gate in such case.

In some other embodiments, the processing module 103 may be driven directly based on the update signal, i.e., the update signal is directly used as the driving clock signal of the processing module 103, so that the processing module 103 can be driven based on the update signal to update the monitoring address in the counting module 102.

In the above-mentioned embodiments, the first processing unit 301 transmits the counting value of the first counter and the predetermined value based on the control of the update signal, and the comparison unit 302 and the second processing unit 303 operate directly based on the counting value transmitted by the first counter and the predetermined value without the control of the update signal. In some embodiments, the first processing unit 301 is configured to receive the counting value of the first counter and the predetermined value corresponding to each monitoring address, and continuously latch and transmit the counting value of the first counter and the predetermined value to the comparison unit 302. The comparison unit 302 is configured to compare the counting value of the first counter with the predetermined value and generate and output a release control signal when the counting value of the first counter is smaller than the predetermined value. The second processing unit 303 releases the corresponding monitoring address in the counting module 102 based on the release control signal and resets the first counter and the predetermined value (the second counter) corresponding to the monitoring address, that is, none of the first processing unit 301, the comparison unit 302, and the second processing unit 303 needs to continuously operate based on the update signal. In some other embodiments, it may alternatively be set that, the first processing unit 301, the comparison unit 302, and the second processing unit 303 each perform the corresponding operations based on the control of the update signal.

With respect to the update signal in the previous description, in some embodiments, the update signal includes a refresh signal and a count adjustment signal. The refresh signal is configured to instruct the memory to perform a refresh operation. The count adjustment signal is provided within an interval between two adjacent refresh signals. The count adjustment signal is a newly defined signal in a refresh cycle and is configured to update the monitoring address retained in the counting module 102 based on the counting value and the predetermined value. The refresh signal and the count adjustment signal jointly serve as the update signal to increase the frequency of releasing the monitoring addresses in the counting module 102 by the processing module 103, thereby further reducing the number of counters that need to be driven by the monitoring circuit. In addition, by increasing the number of update signals, the monitoring frequency of activated word line addresses is increased to prevent burst activation of some activated word line addresses for a plurality of times in a short time.

In addition, with respect to the count adjustment signal in the same refresh cycle, the number of count adjustment signals can be adjusted based on the specific application requirements of the memory, thereby allowing an adaptive adjustment of the frequency of releasing the monitoring address in the counting module 102 by the processing module 103.

With respect to the memory to which the monitoring circuit provided in some embodiments belongs, the refresh operation of the memory further includes refreshing adjacent rows of y monitoring addresses with the largest counting value in the corresponding first counter among the monitoring addresses retained in the counting module 102, where y is a positive integer greater than or equal to 1; and after the refreshing, releasing the y monitoring addresses with the largest counting value in the counting module 102, and resetting the first counter and the predetermined value (the second counter) corresponding to the y monitoring addresses with the largest counting value.

In some embodiments, if the first processing unit 301 latches and transmits the counting value of the first counter and the predetermined value to the comparison unit 302 based on the control of the update signal, the comparison unit 302 compares the counting value of the first counter with the predetermined value. Because the predetermined value also needs to be adjusted based on the update signal, and the predetermined value latched and transmitted based on the update signal may be a predetermined value that has not been updated. As a result, the comparison result cannot represent a real-time monitoring result. In some specific applications, the update signal provided to the first processing unit 301 can be delayed relative to the update signal provided to the adjustment subunit 203 to ensure that the first processing unit 301 can latch the updated predetermined value based on the update signal.

In some embodiments, if the first processing unit 301 latches and transmits the counting value of the first counter and the predetermined value to the comparison unit 302, the comparison unit 302 compares the counting value of the first counter with the predetermined value based on the control of the update signal. With reference to the example of FIG. 5, when the update signal is a refresh signal, the comparison unit 302 compares the counting value of the first counter with the predetermined value based on the update signal. In such case, the result of comparison is delayed relative to the update signal to some extent, that is, when the refresh signal is valid, the data (Address1-4) recorded in the first counting module has not been released, and it cannot be determined which address is an updated and retained address. Therefore, it is necessary to perform refresh based on the next refresh signal before the updated and retained monitoring address Address5 is known.

In some specific applications, timing of the update signal and the refresh signal can be set to delay the providing of the refresh signal that is used by the memory to perform a refresh operation, that is, the refresh signal is provided after the data (Address1-4) recorded in the first counting module is released. As such, the updated and retained monitoring address Address5 can be identified, thereby synchronizing the update of the data in the counting module 102 with the refresh of the monitoring address whose counting value is larger than the predetermined value.

In some other embodiments, if the first processing unit 301 continuously latches and transmits the counting value of the first counter and the predetermined value to the comparison unit 302, the comparison unit 302 can compare the counting value of the first counter with the predetermined value in real time. That is, after updating the predetermined value based on the update signal, the comparison unit 302 can compare the updated predetermined value with the counting value of the first counter in a timely manner and generate a release control signal based on the comparison result. With reference to the example of FIG. 5, when the update signal is a refresh signal, the monitoring circuit releases the monitoring addresses Address1, Address2, Address3, and Address4 based on the release control signal, and the memory releases the monitoring address Address5 in the counting module 102 after refreshing the adjacent rows of the monitoring address Address5 based on the update signal, and resets the first counter and the predetermined value (the second counter) corresponding to the monitoring address Address5.

In the monitoring circuit provided in some embodiments, the processing module 103 continuously releases a monitoring address whose counting value is less than the predetermined value in the counting module 102 based on the update signal, that is, continuously releases a noise address recorded in the counting module 102, so that the counting module 102 can record a new monitoring address to avoid a waste of counter resources caused by continuous recording of the noise address and reduce the number of first counters that need to be driven by the monitoring circuit, thereby reducing power consumption of the monitoring circuit. In addition, the processing module 103 retains a monitoring address whose counting value is greater than or equal to the predetermined value, and the adjacent rows of the monitoring address are used for supplementary refresh of the memory, that is, a word line address with a number of activation times being greater than a predetermined value is retained to ensure accuracy of data stored in each storage region.

It should be noted that the features disclosed in the monitoring circuit provided in the above-mentioned embodiments can be combined arbitrarily provided that no conflict occurs to obtain new monitoring circuit embodiments.

Some other embodiments of the present invention provide a refresh method, which is applied to the monitoring circuit provided in the above-mentioned embodiments to implement supplementary refresh of a specific row in a storage region with low power consumption, thereby ensuring the accuracy of data stored in each storage region and reducing the number of counters that need to be driven by a memory. This is more suitable for actual design of a memory.

Figure 8:
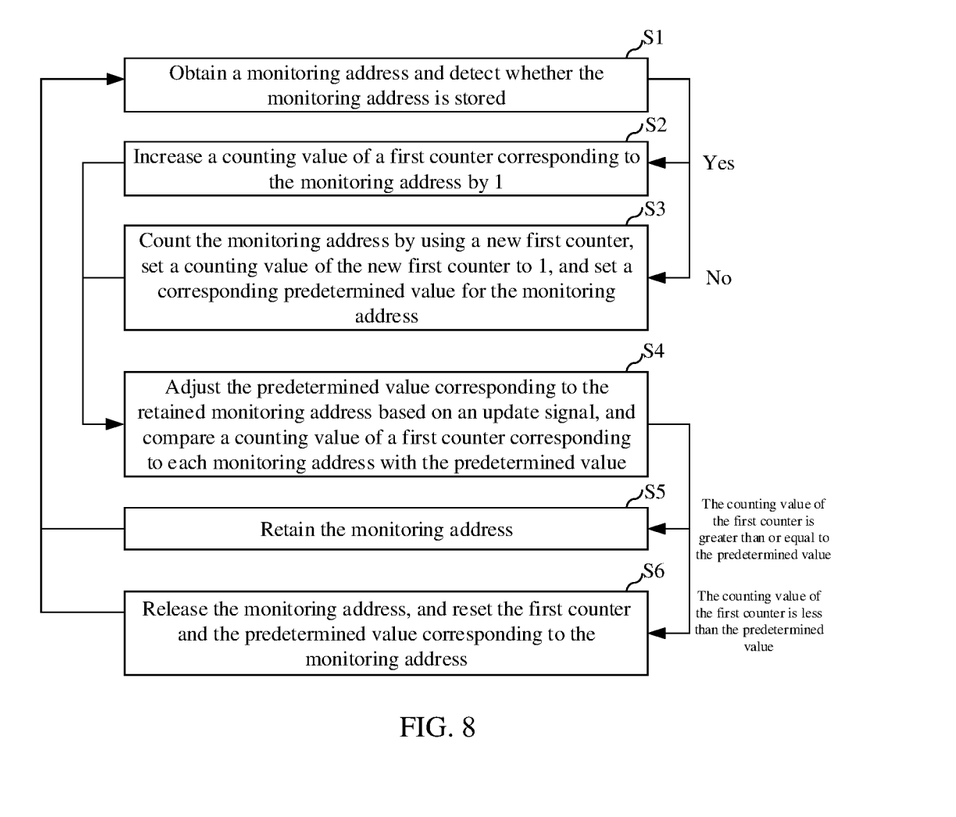
FIG. 8 is a schematic flowchart illustrating the corresponding steps of a refresh method according to some other embodiments of the present invention.

FIG. 8 is a schematic flowchart illustrating the corresponding steps of a refresh method according to some embodiments. The refresh method provided in some embodiments is described below in detail with reference to the accompanying drawings. Details are as follows:

Referring to FIG. 8, the refresh method includes the following steps.

Step S1: Obtain a monitoring address and detect whether the monitoring address is stored, where if the monitoring address is stored, perform step S2, and if the monitoring address is not stored, perform step S3.

The monitoring address is a word line address activated in the memory. If the monitoring address has been stored, it indicates that the currently activated word line address has been counted, and the counting needs to be continued based on step S2. If the monitoring address has not been stored, it indicates that the currently activated word line address has not been counted, and a first counter needs to be set based on step S3 to start counting, and a corresponding predetermined value is set. It should be noted that, both the counting value of the first counter and the predetermined value are initially set to 0, and are reset to 0 after the counting value of the first counter and the predetermined value are reset. Therefore, after a new monitoring address is added, the counting value of a first counter and a predetermined value need to be assigned.

In some embodiments, in step S1, sampling is performed based on a predetermined interval to obtain the monitoring address, and the predetermined interval is set to perform sampling on the monitoring address once upon occurrence of every x initial addresses, where x is a positive integer. In other words, each time the memory activates x word line addresses, the sampling module 101 performs sampling on the monitoring address once. By setting a sampling probability, the number of word line addresses that need to be obtained is reduced. In other words, the power consumption needed for refresh is further reduced through sampling detection. In some embodiments, x is a positive integer less than or equal to 16. In some embodiments, x may be set to a positive integer such as 14, 12, 10, 8, 6, 4, or 2.

Step S2: Increase a counting value of a first counter corresponding to the monitoring address by 1, and then perform step S4.

With respect to the first counter, the capacity of the first counter is set based on a time interval for receiving a refresh command, a predetermined interval for sampling, and a time interval for activating a word line in the memory. In some embodiments, in the DDR4 standard, under a normal operating temperature, for a memory with a 16G capacity in a 1× refresh mode, the time interval for activating a word line is tRC=45 ns, the predetermined interval for sampling is tREFC=550 ns, and the time interval for receiving a refresh command is tREFI=7.8 us. In such case, in a burst transmission mode of the memory, the number of word line addresses that can be activated by the memory within 9*tREFI is 9*(tREFI—tREFC)/tRC=161. If a capacity of the first counter is b, it needs to be ensured that $2^b > 161$, that is, b is at least 8. In such case, the capacity of the first counter is set to 8 bits. It should be noted that the example value in such case is merely used for a person skilled in the art to understand the method for setting the capacity of the first counter and does not constitute a limitation on the embodiments.

Step S3: Count the monitoring address by using a new first counter, set a counting value of the new first counter to 1, and set a corresponding predetermined value for the monitoring address, and then perform step S4.

In some embodiments, a newly added monitoring address is obtained, and a predetermined value corresponding to the monitoring address is set based on a first initial value.

With respect to steps S1 to S3, in some embodiments, referring to FIG. 5 and with reference to FIG. 2 and FIG. 3, the determining unit 132 generates a first control signal when receiving the monitoring address Address1 sampled by the sampling module 101, and the counting unit 112 controls the counting value of the first counter corresponding to the monitoring address Address1 to increase by 1 (from 10 to 11). The determining unit 132 generates a first control signal when receiving the monitoring address Address3 sampled by the sampling module 101, and the counting unit 112 controls the counting value of the first counter corresponding to the monitoring address Address3 to increase by 1 (from 19 to 20). When the determining unit 132 receives the monitoring address Address6 sampled by the sampling module 101, because the counting module 102 does not include the monitoring address Address6, the determining unit 132 generates a second control signal. In such case, the counting unit 112 adds the new monitoring address Address6 and sets the counting value of the first counter corresponding to the monitoring address Address6 to 1, and the reference unit 122 sets a predetermined value 4+4*0 for the monitoring address Address6.

Step S4: Adjust the predetermined value corresponding to the retained monitoring address based on an update signal and compare a counting value of a first counter corresponding to each monitoring address with the predetermined value; if the counting value of the first counter is greater than or equal to the predetermined value, perform step S5; if the counting value of the first counter is less than the predetermined value, perform step S6.

In some embodiments, referring to FIG. 4, the counting value is the counting result of the first counter, and is used to represent the number of times the corresponding monitoring address is counted. The predetermined value is the counting result of the second counter and is used to represent a recorded reference value of the corresponding monitoring address, where c represents the first initial value that is set by the setting subunit 201, y represents the step for each adjustment by the adjustment subunit 203, and t1-t5 represent the number of update cycles during which the corresponding monitoring address is stored. With respect to a monitoring address whose counting value is greater than or equal to a predetermined value, that is, a word line address with the number of activation times reaching a predetermined number of times in the memory, there is a risk of malicious attack, and the corresponding monitoring address requires supplementary refresh. With respect to a monitoring address whose counting value is less than a predetermined value, no supplementary refresh is required because the monitoring address is a normally accessed word line address. In addition, a continuously activated word line address is more likely to cause an error in data in adjacent storage regions. In some embodiments, the predetermined value corresponding to the monitoring address is set to gradually increase with an increase of the retention time of the monitoring address. In other words, only the continuously activated word line address is more likely to cause an error in data stored in adjacent storage regions. Such an address deserves more attention and should be retained. In addition, adjacent rows of such an address should be refreshed.

In some embodiments, the first initial value is set to 2n, and the second initial value is set to 2 m, where m and n are positive integers greater than or equal to 1. In some embodiments, m and n may be set to 2, 3, 4 or 5. Correspondingly, m and n may be set to the same value, or may be set to different values.

With respect to step S4, in some embodiments, referring to FIG. 5 and with reference to FIG. 2 and FIG. 3, when the reference unit 122 receives an update signal, it indicates that the recorded monitoring address has been stored for one more update cycle, and the reference unit 122 adjusts the predetermined value corresponding to the monitoring address in the counting unit 112, where the predetermined value of the monitoring address Address 1 changes from 4+4*1 to 4+4*2, the predetermined value of the monitoring address Address2 changes from 4+4*0 to 4+4*1, the predetermined value of the monitoring address Address3 changes from 4+4*5 to 4+4*6, the predetermined value of the monitoring address Address4 changes from 4+4*0 to 4+4*1, and the predetermined value of the monitoring address Address5 changes from 4+4*2 to 4+4*3. A continuously activated word line address is more likely to cause an error in data in adjacent storage regions. The predetermined value corresponding to the monitoring address is set to gradually increase with an increase of the retention time of the monitoring address. In other words, only the continuously activated word line address is more likely to cause an error in data stored in adjacent storage regions. Such an address deserves more attention and should be retained. In addition, adjacent rows of such an address should be refreshed.

Step S5: Retain the monitoring address and continue to perform step S1.

In some embodiments, with respect to the retained monitoring address, the second counter corresponding to the retained monitoring address is accumulated based on the second initial value, that is, the retained monitoring address adjusted based on the update signal is obtained, and the second counter corresponding to the corresponding monitoring address is accumulated based on the second initial value.

Step S6: Release the monitoring address, reset the first counter and the predetermined value corresponding to the monitoring address, and continue to perform step S1.

With respect to steps S5 and S6, in some embodiments, referring to FIG. 5 and with reference to FIG. 2 and FIG. 3, the processing module 103 compares the counting value of each monitoring address with the predetermined value, retains the monitoring address whose counting value is greater than or equal to the predetermined value, and releases the monitoring address whose counting value is less than the predetermined value. After the comparison, in the counting unit 112, the monitoring address Address5 is retained and other monitoring addresses are released, and the corresponding first counters and predetermined values are reset.

In the above-mentioned implementations, the first initial value set for the predetermined value of the monitoring address is 4, and the second initial value accumulated based on the update signal is set to 4. After the update signal is received, the predetermined value of the retained monitoring address is first accumulated, and then the counting value is compared with the predetermined value. In some other implementations, after the update signal is received, it may alternatively be set that the counting value is first compared with the predetermined value, and then the predetermined value of the retained monitoring address is accumulated to reduce the number of second counters that need to be adjusted by the monitoring circuit, thereby reducing the power consumption of the monitoring circuit.

In addition, in some embodiments, the predetermined value has a maximum value, and the value of the second counter does not continue to be accumulated after reaching the maximum value. When the counting value of the first counter corresponding to the monitoring address is greater than or equal to the maximum value, it indicates that the data in the storage region adjacent to the monitoring address is prone to an error and requires supplementary refresh. In such case, the predetermined value does not need to be accumulated, thereby avoiding unnecessary update of the value of the second counter.

With respect to the update signal in the previous description, in some embodiments, the update signal includes a refresh signal and a count adjustment signal. The refresh signal is configured to instruct the memory to perform a refresh operation. The count adjustment signal is provided within an interval between two adjacent refresh signals. The count adjustment signal is a newly defined signal in a refresh cycle and is configured to update the retained monitoring address based on the counting value and the predetermined value. The refresh signal and the count adjustment signal jointly serve as the update signal to increase the frequency of releasing the monitoring addresses, thereby further reducing the number of counters that need to be driven by the monitoring circuit. In addition, by increasing the number of update signals, the monitoring frequency of activated word line addresses is increased to prevent burst activation of some activated word line addresses for a plurality of times in a short time.

In addition, with respect to the count adjustment signal in the same refresh cycle, the number of count adjustment signals can be adjusted based on the specific application requirements of the memory, thereby allowing an adaptive adjustment of the frequency of releasing the monitoring address.

In the refresh method provided in some embodiments, a monitoring address whose counting value is less than the predetermined value is continuously released based on the update signal, that is, a recorded noise address is continuously released, so that the counting module can record a new monitoring address to avoid a waste of counter resources caused by continuous recording of the noise address and reduce the number of first counters that need to be driven by the monitoring circuit, thereby reducing power consumption of the monitoring circuit. In addition, a monitoring address whose counting value is greater than or equal to the predetermined value is retained, and the adjacent rows of the monitoring address are used for supplementary refresh of the memory, that is, a word line address with a number of activation times being greater than a predetermined value is retained to ensure accuracy of data stored in each storage region.

It should be noted that the features disclosed in the refresh method provided in the above-mentioned embodiments can be combined arbitrarily provided that no conflict occurs to obtain new refresh method embodiments.

Still some other embodiments of the present invention provide a memory, which obtains a word line address to be refreshed based on the monitoring circuit provided in the above-mentioned embodiments to implement supplementary refresh of a specific row in a storage region with low power consumption, thereby ensuring the accuracy of data stored in each storage region and reducing the number of counters that need to be driven by a memory. This is more suitable for actual design of a memory.

In some embodiments, with respect to the monitoring circuit, the processing module continuously releases a monitoring address whose counting value is less than the predetermined value in the counting module based on the update signal, that is, continuously releases a noise address recorded in the counting module, so that the counting module can record a new monitoring address to avoid a waste of counter resources caused by continuous recording of the noise address and reduce the number of first counters that need to be driven by the monitoring circuit, thereby reducing power consumption of the monitoring circuit. In addition, the processing module retains a monitoring address whose counting value is greater than or equal to the predetermined value, and the adjacent rows of the monitoring address are used for supplementary refresh of the memory, that is, a word line address with a number of activation times being greater than a predetermined value is retained to ensure accuracy of data stored in each storage region.

In some embodiments, the memory may be a storage unit or device that is based on a semiconductor device or component. For example, the memory device may be a volatile memory such as a dynamic random access memory (DRAM), a synchronous dynamic random access memory (SDRAM), a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a double data rate 2 synchronous dynamic random access memory (DDR2 SDRAM), a double data rate 3 synchronous dynamic random access memory (DDR3 SDRAM), a double data rate fourth generation synchronous dynamic random access memory (DDR4 SDRAM), a thyristor random access memory (TRAM), or the like. Alternatively, the memory device may be a non-volatile memory, such as a phase-change random access memory (PRAM), a magnetic random access memory (MRAM), a resistive random access memory (RRAM), or the like.

A person of ordinary skill in the art can understand that the above-mentioned embodiments are some specific embodiments for implementing the present invention. In practice, various form and detail changes can be made to the embodiments of the present invention without departing from the spirit and scope of the present invention.

What is claimed is:

1. A monitoring circuit, comprising:
a sampling module, configured to sample an initial address to obtain a monitoring address, wherein the initial address is a word line address activated in a memory in which the monitoring circuit is located;
a counting module, connected to the sampling module and configured to adjust a counting value of a first counter corresponding to the monitoring address based on the monitoring address obtained, and further configured to set a predetermined value for the monitoring address, and a magnitude of the predetermined value is positively correlated with duration for which the monitoring address is stored in the counting module; and
a processing module, connected to the counting module and configured to compare the counting value of the first counter corresponding to the monitoring address with the predetermined value based on an update signal, wherein if the counting value of the first counter is greater than or equal to the predetermined value, the monitoring address is retained, and if the counting value of the first counter is less than the predetermined value, the monitoring address is released, and the first counter and the predetermined value corresponding to the monitoring address are reset.

2. The monitoring circuit according to claim 1, wherein the counting module comprises:
a determining unit, connected to the sampling module and configured to determine whether the monitoring address obtained is stored based on the monitoring address obtained and a monitoring address stored, and generate a first control signal if the monitoring address is stored, or generate a second control signal if the monitoring address is not stored;
a counting unit, connected to the sampling module and the determining unit, and configured to increase the counting value of the first counter corresponding to the monitoring address by 1 based on the first control signal, or add a new first counter corresponding to the monitoring address and set a counting value of the new first counter to 1 based on the second control signal; and
a reference unit, connected to the counting unit and the determining unit, and configured to set the predetermined value for the monitoring address based on the second control signal, store the predetermined value in the counting unit, and adjust the predetermined value based on the update signal.

3. The monitoring circuit according to claim 2, wherein the magnitude of the predetermined value is positively correlated with the duration for which the monitoring address is stored in the counting module, comprising: the magnitude of the predetermined value is positively correlated with a number of update cycles during which the monitoring address is retained in the counting module, wherein the update cycle is a time interval between adjacent update signals.

4. The monitoring circuit according to claim 2, wherein the counting unit is further configured to discard the newly added monitoring address, based on the second control signal, when each of the first counters in the counting unit has the corresponding monitoring address.

5. The monitoring circuit according to claim 3, wherein the reference unit comprises:
a setting subunit, connected to the counting unit and the determining unit, and configured to set the predetermined value corresponding to the monitoring address based on a first initial value in response to the second control signal; and
an adjustment subunit, configured to receive the update signal and adjust, based on the update signal, the predetermined value corresponding to the monitoring address retained in the counting unit.

6. The monitoring circuit according to claim 5, wherein the predetermined value is a counting result of a second counter in the counting unit, and wherein the adjusting, based on the update signal, the predetermined value corresponding to the monitoring address retained in the counting unit comprises: accumulating a second initial value to the second counter corresponding to the retained monitoring address based on the update signal.

7. The monitoring circuit according to claim 6, wherein the first initial value is set to 2n and the second initial value is set to 2m, wherein m and n are positive integers greater than or equal to 1.

8. The monitoring circuit according to claim 1, wherein the processing module comprises:
   a first processing unit, connected to the counting module and configured to receive the counting value of the first counter and the predetermined value corresponding to each monitoring address, and latch and transmit, based on control of the update signal, the counting value of the first counter and the predetermined value to a comparison unit, wherein
   the comparison unit is connected to the first processing unit and is configured to compare the counting value of the first counter with the predetermined value, and generate and output a release control signal when the counting value of the first counter is smaller than the predetermined value; and
   a second processing unit, connected to the comparison unit and the counting module, and configured to release the corresponding monitoring address in the counting module based on the release control signal, and reset the first counter and the predetermined value corresponding to the monitoring address.

9. The monitoring circuit according to claim 8, wherein the latching and transmitting, based on the control of the update signal, the counting value of the first counter and the predetermined value to a comparison unit comprises: the update signal controls an input of a driving clock signal, wherein when the update signal has a valid level, the driving clock signal is input to the processing module, or when the update signal has an invalid level, no driving clock signal is input, and wherein when the driving clock signal is input, the processing module latches and transmits the counting value of the first counter and the predetermined value to the comparison unit.

10. The monitoring circuit according to claim 1, wherein the sampling module performs sampling based on a predetermined interval to obtain the monitoring address, and the predetermined interval is set to perform sampling on the monitoring address once upon occurrence of every x initial addresses, wherein x is a positive integer.

11. The monitoring circuit according to claim 10, wherein x is a positive integer less than or equal to 16.

12. The monitoring circuit according to claim 1, wherein the update signal comprises a refresh signal and a count adjustment signal, wherein the refresh signal is configured to instruct the memory to perform a refresh operation, and the count adjustment signal is provided within an interval between two adjacent refresh signals.

13. The monitoring circuit according to claim 12, wherein the refresh operation of the memory further comprises refreshing adjacent rows of y monitoring addresses with a largest counting value in the corresponding first counter among the monitoring addresses retained in the counting module, wherein y is a positive integer greater than or equal to 1; and after the refreshing, releasing the y monitoring addresses with the largest counting value in the counting module, and resetting the first counter and the predetermined value corresponding to the y monitoring addresses with the largest counting value.

14. A method for refreshing a monitoring circuit, wherein the monitoring circuit comprises a sampling module, a counting module connected to the sampling module, and a processing module connected to the counting module, and wherein the method comprises:
   obtaining a monitoring address and detecting whether the monitoring address is stored, wherein if the monitoring address is stored, increasing a counting value of a first counter corresponding to the monitoring address by 1, and if the monitoring address is not stored, counting the monitoring address by using a new first counter, setting a counting value of the new first counter is set to 1, and setting a predetermined value corresponding to the monitoring address; and
   adjusting the predetermined value corresponding to the monitoring address based on an update signal, and comparing the counting value of the first counter corresponding to the monitoring address with the predetermined value, wherein if the counting value of the first counter is greater than or equal to the predetermined value, retaining the monitoring address, and if the counting value of the first counter is less than the predetermined value, releasing the monitoring address, and resetting the first counter and the predetermined value corresponding to the monitoring address.

15. The method according to claim 14, wherein setting the predetermined value corresponding to the monitoring address comprises: obtaining a newly added monitoring address, and setting a predetermined value corresponding to the newly added monitoring address based on a first initial value, and wherein the adjusting the predetermined value corresponding to the retained monitoring address based on an update signal comprises: accumulating the predetermined value corresponding to the retained monitoring address based on a second initial value.

16. A memory, configured to obtain a word line address to be refreshed by a monitoring circuit located in the memory, wherein the monitoring circuit comprises:
   a sampling module, configured to sample an initial address to obtain a monitoring address, wherein the initial address is the word line address;
   a counting module, connected to the sampling module and configured to adjust a counting value of a first counter corresponding to the monitoring address based on the monitoring address obtained, and further configured to set a predetermined value for the monitoring address, and a magnitude of the predetermined value is positively correlated with duration for which the monitoring address is stored in the counting module; and
   a processing module, connected to the counting module and configured to compare the counting value of the first counter corresponding to the monitoring address with the predetermined value based on an update signal, wherein if the counting value of the first counter is greater than or equal to the predetermined value, the monitoring address is retained, and if the counting value of the first counter is less than the predetermined value, the monitoring address is released, and the first counter and the predetermined value corresponding to the monitoring address are reset.

17. The memory according to claim 16, wherein the counting module comprises:
   a determining unit, connected to the sampling module and configured to determine whether the monitoring address obtained is stored based on the monitoring address obtained and a monitoring address stored, and generate a first control signal if the monitoring address is stored, or generate a second control signal if the monitoring address is not stored;

a counting unit, connected to the sampling module and the determining unit, and configured to increase the counting value of the first counter corresponding to the monitoring address by 1 based on the first control signal, or add a new first counter corresponding to the monitoring address and set a counting value of the new first counter to 1 based on the second control signal; and a reference unit, connected to the counting unit and the determining unit, and configured to set the predetermined value for the monitoring address based on the second control signal, store the predetermined value in the counting unit, and adjust the predetermined value based on the update signal.

18. The memory according to claim 17, wherein the magnitude of the predetermined value is positively correlated with the duration for which the monitoring address is stored in the counting module, comprising: the magnitude of the predetermined value is positively correlated with a number of update cycles during which the monitoring address is retained in the counting module, wherein the update cycle is a time interval between adjacent update signals.

19. The memory according to claim 18, wherein the reference unit comprises:

a setting subunit, connected to the counting unit and the determining unit, and configured to set the predetermined value corresponding to the monitoring address based on a first initial value in response to the second control signal; and an adjustment subunit, configured to receive the update signal and adjust, based on the update signal, the predetermined value corresponding to the monitoring address retained in the counting unit.

20. The memory according to claim 19, wherein the predetermined value is a counting result of a second counter in the counting unit, and wherein the adjusting, based on the update signal, the predetermined value corresponding to the monitoring address retained in the counting unit comprises: accumulating a second initial value to the second counter corresponding to the retained monitoring address based on the update signal.

* * * * *